United States Patent
Dening

(10) Patent No.: US 6,969,978 B2
(45) Date of Patent: Nov. 29, 2005

(54) DC-DC CONVERTER WITH REDUCED ELECTROMAGNETIC INTERFERENCE

(75) Inventor: David Dening, Stokesdale, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/389,849

(22) Filed: Mar. 17, 2003

(65) Prior Publication Data

US 2004/0183511 A1 Sep. 23, 2004

(51) Int. Cl.[7] ............................................. G04F 1/40
(52) U.S. Cl. ..................................... 323/282; 323/288
(58) Field of Search ............................. 323/222, 282, 323/283, 284, 285, 288; 315/208, 291; 331/34, 331/40

(56) References Cited

U.S. PATENT DOCUMENTS

| | | | | |
|---|---|---|---|---|
| 4,064,414 | A | * | 12/1977 | Bergeson et al. ........... 315/208 |
| 5,608,353 | A | | 3/1997 | Pratt .......................... 330/295 |
| 5,629,648 | A | | 5/1997 | Pratt .......................... 330/289 |
| 5,808,453 | A | | 9/1998 | Lee et al. .................... 323/224 |
| 5,870,296 | A | | 2/1999 | Schaffer ....................... 363/65 |
| 6,130,579 | A | | 10/2000 | Iyer et al. ................... 330/285 |
| 6,137,274 | A | | 10/2000 | Rajagopalan ............... 323/272 |
| 6,191,656 | B1 | | 2/2001 | Nadler ....................... 330/288 |
| 6,229,395 | B1 | | 5/2001 | Kay ............................ 330/252 |
| 6,265,943 | B1 | | 7/2001 | Dening et al. ............. 330/296 |
| 6,271,727 | B1 | | 8/2001 | Schmukler .................. 330/284 |
| 6,285,239 | B1 | | 9/2001 | Iyer et al. ................... 327/531 |
| 6,307,364 | B1 | | 10/2001 | Augustine .................... 324/95 |
| 6,313,705 | B1 | | 11/2001 | Dening et al. ............. 330/276 |
| 6,329,809 | B1 | | 12/2001 | Dening et al. ............... 324/95 |
| 6,333,677 | B1 | | 12/2001 | Dening ....................... 330/296 |
| 6,356,150 | B1 | | 3/2002 | Spears et al. ............... 330/145 |
| 6,369,656 | B2 | | 4/2002 | Dening et al. ............. 330/296 |
| 6,369,657 | B2 | | 4/2002 | Dening et al. ............. 330/296 |
| 6,384,433 | B1 | | 5/2002 | Barratt et al. ............. 257/197 |
| 6,385,276 | B1 | | 5/2002 | Hunt, Jr. et al. ............ 377/47 |
| 6,387,733 | B1 | | 5/2002 | Holyoak et al. ........... 438/123 |
| 6,392,487 | B1 | | 5/2002 | Alexanian ................... 330/254 |
| 6,404,287 | B2 | | 6/2002 | Dening et al. ............. 330/296 |
| 6,414,469 | B1 | | 7/2002 | Zhou et al. ................. 323/272 |
| 6,418,174 | B1 | | 7/2002 | Benedict .................... 375/303 |
| 6,448,831 | B1 | | 9/2002 | Hunt, Jr. et al. ........... 327/211 |
| 6,525,611 | B1 | | 2/2003 | Dening et al. ............. 330/298 |
| 6,528,983 | B1 | | 3/2003 | Augustine .................... 324/95 |
| 6,560,452 | B1 | | 5/2003 | Shealy ........................ 455/333 |
| 6,566,963 | B1 | | 5/2003 | Yan et al. ................... 330/311 |
| RE38,140 | E | | 6/2003 | Schaffer ....................... 363/65 |
| 6,600,295 | B2 | * | 7/2003 | Kanekawa et al. ......... 323/222 |

(Continued)

FOREIGN PATENT DOCUMENTS

EP 1235335 A2 8/2002 .......... H02M 3/156

(Continued)

OTHER PUBLICATIONS

Yang, Ken, "Spread-Spectrum DC-DC Converter Combats EMI," Electronic Design, Nov. 5, 2001, pp. 86-88.

(Continued)

Primary Examiner—Jessica Han
(74) Attorney, Agent, or Firm—Withrow & Terranova, PLLC

(57) ABSTRACT

A DC-DC converter includes a variable frequency oscillator, a control system and a power train. The DC-DC converter is well suited for use in a cell phone. The control system uses the output of the oscillator to control the power train. The oscillator varies its frequency as a function of a pseudo random number generator, thereby reducing electromagnetic interference caused by ripple in the output of the DC-DC converter.

14 Claims, 15 Drawing Sheets

U.S. PATENT DOCUMENTS

| | | | |
|---|---|---|---|
| 6,701,138 B2 | 3/2004 | Epperson et al. | 455/127 |
| 6,734,724 B1 | 5/2004 | Schell et al. | 330/10 |
| 2003/0054778 A1 | 3/2003 | Hecht | 455/115 |

FOREIGN PATENT DOCUMENTS

| | | | |
|---|---|---|---|
| GB | 2232835 A | 12/1990 | H02P 7/00 |

OTHER PUBLICATIONS

"Digital Cellular Telecommunications System (Phase 2+); Radio Transmission and Reception (GSM 05.05 Version 8.5.1 Release 1999)," ETSI EN 300 910 v8.5.1, Global System for Mobile Communications (GSM), 2000, no month.

P. Asbeck, G. Hanington, P.F. Chen, and L.Larson, "Efficiency and Linearity Improvement in Power Amplifiers for Wireless Communications," University of California, San Diego, La Jolla, CA, IEEE 1998, pp. 15-18, no month.

Biancomano, Vincent, "Spread-Spectrum Clears Up Designs for DC Power," EETIMES, Oct. 14, 2002, XP002299544.

Kinniment, D. J. and Chester, E. G., "Design of an On-Chip Random Number Generator using Metastability," Proceedings of the European Solid State Circuits Conference, Sep. 24, 2002, pp. 595-598, XP002273019.

International Search Report for PCT/US2004/007307, mailed Oct. 14, 2004.

\* cited by examiner

DC-DC CONVERTER WITH REDUCED ELECTROMAGNETIC INTERFERENCE

FIELD OF THE INVENTION

The present invention is related to a DC-DC converter and specifically a switching regulator DC-DC converter with an oscillator whose frequency changes to reduce electromagnetic interference.

BACKGROUND OF THE INVENTION

Mobile terminals such as cellular phones have become ubiquitous in modern society. Mobile terminals rely on sending an electromagnetic signal through the air to a base station and receiving electromagnetic signals through the air from the base station. An unfortunate side effect of the convenience of this wireless communication is that the signal-carrying electromagnetic radiation that forms the backbone of the communication may interfere with other electronic devices. This phenomenon is known variously as electromagnetic interference (EMI) or electromagnetic compatibility (EMC).

While interfering with other electronic devices like a computer or television is problematic, it is also possible for multiple mobile terminals operating in proximity to one another to have cross channel EMI. That is, one mobile terminal may be transmitting in a first channel, but some of the signal may spill over as noise into channels that are nearby in the frequency spectrum and on which a second mobile terminal is trying to operate. This spill over transmission is known by various terms, but is termed herein as "side band transmission."

To combat EMI in the United States, the FCC has promulgated standards for emissions that limit how much radiation may be radiated within certain frequency bands. On top of the FCC emissions rules, the various communication protocols used by mobile terminals may impose more restrictive limitations with specific attention paid to side band transmission levels. For example, Annex A of the GSM 05.05 version 8.5.1, released 1999, indicates that the maximum allowed signal for spurious side band signals is the larger of −60 dBc or −36 dBm. This measurement is to be averaged over at least two hundred transmit power cycles.

Against the backdrop of these standards, many mobile terminals incorporate DC-DC converters in their internal circuitry to change a DC voltage level of a battery to a lower or higher DC voltage level depending on the needs of the internal circuitry of the mobile terminal. A common method to implement a DC-DC converter uses a switching power supply that has a switch that opens and closes at a predetermined frequency according to a clock signal. Such switching power supplies exhibit a periodic ripple in their output at the switching frequency. If the DC-DC converter is used to provide a Vcc supply voltage to a saturated power amplifier, this ripple may mix with the radio frequency carrier to generate spurious side band signals.

To combat this ripple, manufacturers tend to use low drop out linear regulators for power control associated with power amplifiers instead of the switching DC-DC converters. This substitution avoids the ripple issues, but does so at the expense of decreased efficiency and shorter battery life. Thus, there exists a need for a way to reduce spurs in a power amplifier's output while using an efficient switching power supply as a supply voltage for power amplifiers.

SUMMARY OF THE INVENTION

The present invention minimizes spurious emissions by spreading the frequency at which an oscillator in a switching power supply operates. Specifically, the present invention represents a modification to a switching power supply that can be used in a myriad of mobile terminals, although it is especially well suited for use with Global System for Mobile Communications (GSM) compatible mobile terminals.

The present invention spreads the frequency of the oscillator, in a first embodiment, by providing a multi-bit shift register that outputs a pseudo random number, in effect forming a pseudo random number generator. This pseudo random number is provided to a pair of digital to analog converters (DACs). One DAC controls and turns on a variable current source such that a current is provided corresponding to the pseudo random number. The other DAC controls and turns on a variable current sink such that a current is drawn corresponding to the pseudo random number. A capacitor is selectively connected to either the current source or the current sink by a switch. When the capacitor is connected to the current source, the capacitor is charged. When the capacitor is connected to the current sink, the capacitor is discharged. The rate of charging and discharging is set by the current that flows as determined by the pseudo random number.

The voltage across the capacitor is measured by two comparators that determine if the voltage has risen above or fallen below predetermined set points. If the voltage has passed out of the range generated by the set points, one of the comparators will trigger a flip-flop causing a clock signal to be generated. This changes the position of the switch, causing the capacitor to switch from charge to discharge or vice versa. Thus, if the capacitor was charging and the voltage exceeded the set point, the flip-flop would be triggered and the switch would move so that the capacitor was connected to the current sink DAC. The capacitor then begins discharging until the comparator detects that the voltage is below the predefined set point and the flip-flop is triggered again.

In addition to controlling the switch, the signal from the flip-flop forms a clock signal for the shift register. To allow the system to settle, the clock signal is divided by a predetermined number before being passed to the shift register such that the pseudo random number changes only after a predetermined number of signals from the flip-flop. In an exemplary embodiment, a new pseudo random number is generated approximately once every four milliseconds.

Still further, the clock signal from the flip-flop acts as the square wave for the switch in the power train portion of the DC-DC converter. This square wave may be modified by a control function in the DC-DC converter if needed or desired.

In a second embodiment, a pseudo random number generator selectively controls an amount of capacitance used in a switching power supply. Specifically, a switching power supply is formed from a plurality of addressable capacitors. The output of the pseudo random number generator determines if a given capacitor is turned on or "activated" so that it can be charged or discharged.

In a third embodiment, a single DAC and a single capacitor are used with current mirrors to reflect the current into the current source and current sink. This embodiment uses more current than the first embodiment, but has the advantage of taking up less space.

In a fourth embodiment, a single DAC is used with a pair of capacitors. One capacitor charges while the other discharges. When the capacitor being charged reaches a threshold, a flip-flop toggles state. The change in state of the flip-flop changes three switches so that the capacitor that was charging now discharges, and the capacitor that was discharging now charges. A comparator switches to the charging capacitor.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
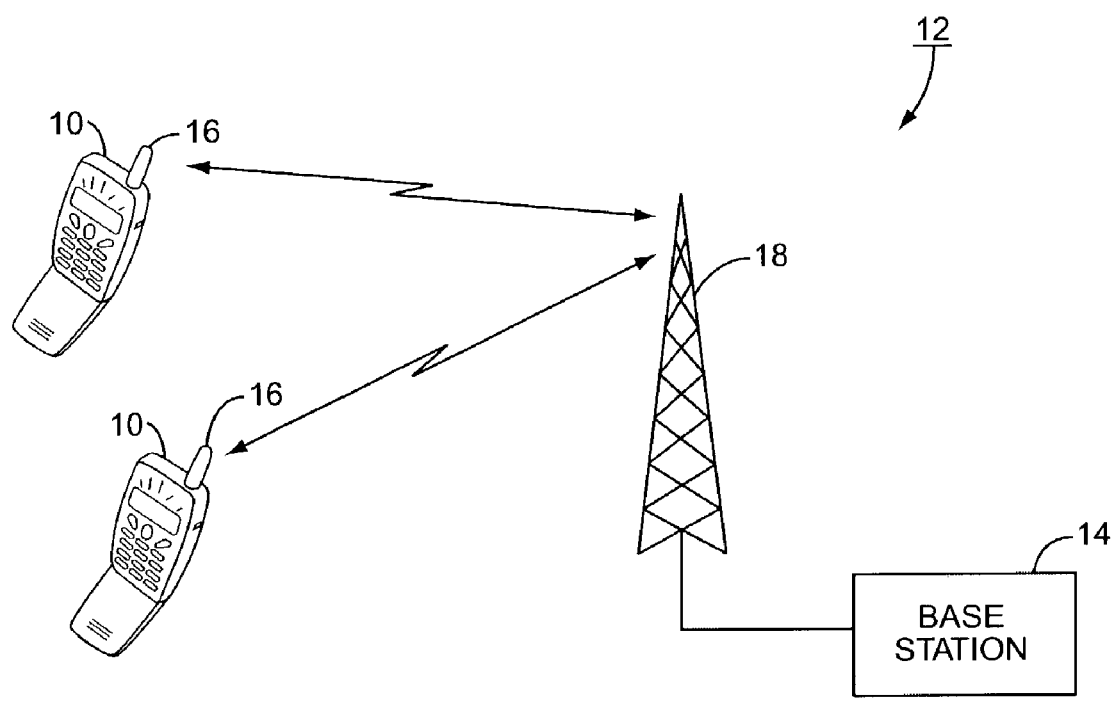
FIG. 1 illustrates a conventional exemplary communication system that may incorporate the present invention.

While the present invention could be used in myriad devices that use a switching power supply, the present invention is optimized to be used in a mobile terminal that operates according to the GSM protocol. For the purposes of illustrating the present invention, the following discussion will assume that a mobile terminal, such as mobile terminals 10 in FIG. 1 operate in a GSM communication environment 12. Thus, mobile terminals 10 communicate with base stations 14 through mobile terminal antennas 16 and base station antennas 18 as is well understood.

Figure 2:
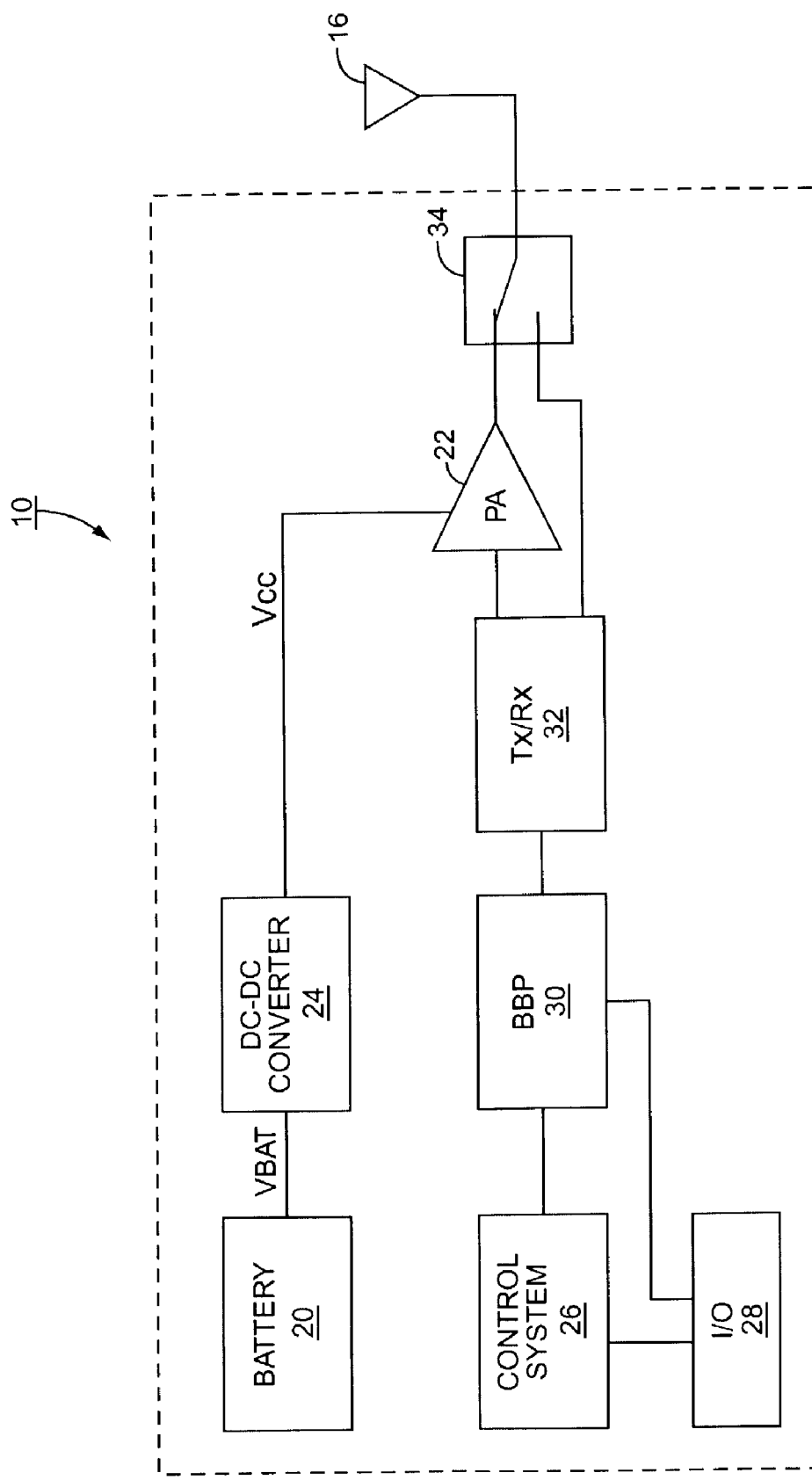
FIG. 2 illustrates a block diagram of a portion of the electronics within a typical mobile terminal.

A more detailed view of an exemplary mobile terminal 10 is presented in FIG. 2. The mobile terminal 10 comprises a battery 20 which powers the components of the mobile terminal 10 and in particular powers a power amplifier (PA) 22. Because the power amplifier 22 may not operate at the voltage level of the battery 20, a DC-DC converter 24 may be positioned between the battery 20 and the power amplifier 22 to convert the output of the battery (VBAT) to a suitable voltage (Vcc) for the power amplifier 22.

The power amplifier 22 is part of a transmitter chain within the mobile terminal 10. Specifically, the mobile terminal 10 may include a conventional control system 26 that controls an input/output (I/O) interface 28 that accepts user supplied inputs such as a voice signal and converts them to an electric signal for processing. The control system 26 passes the signal representative of the voice of the user to a baseband processor (BBP) 30 which performs preliminary processing steps on the signal to condition the signal for transmission. Alternatively, the BBP 30 may receive the signals directly from the input/output interface 28, as is well understood. The signal is then passed to a transceiver (Tx/Rx) 32 where the signal is converted to a radio frequency signal by mixing the signal with a carrier signal as is well understood. The radio frequency signal is then passed to the power amplifier 22 to boost the signal strength to a level appropriate for transmission. The boosted signal passes through a switch 34 and to the antenna 16 for transmission.

In the receive mode, the mobile terminal antenna 16 receives signals from the base station antenna 18 and passes the received signals through the switch 34 to the transceiver 32. The transceiver 32 converts the received signal from a radio frequency signal to a baseband signal before passing the baseband signal to the baseband processor 30 as is well understood.

As noted, in conventional mobile terminals 10, if the DC-DC converter 24 is a switching power supply, a ripple is present in the Vcc signal that passes from the DC-DC converter 24 to the power amplifier 22. This ripple shows up in the output of the power amplifier 22 as a spur in the frequency domain on either side of the carrier frequency. These spurs can appear in the in the neighboring channels causing unwanted interference.

Figure 3:
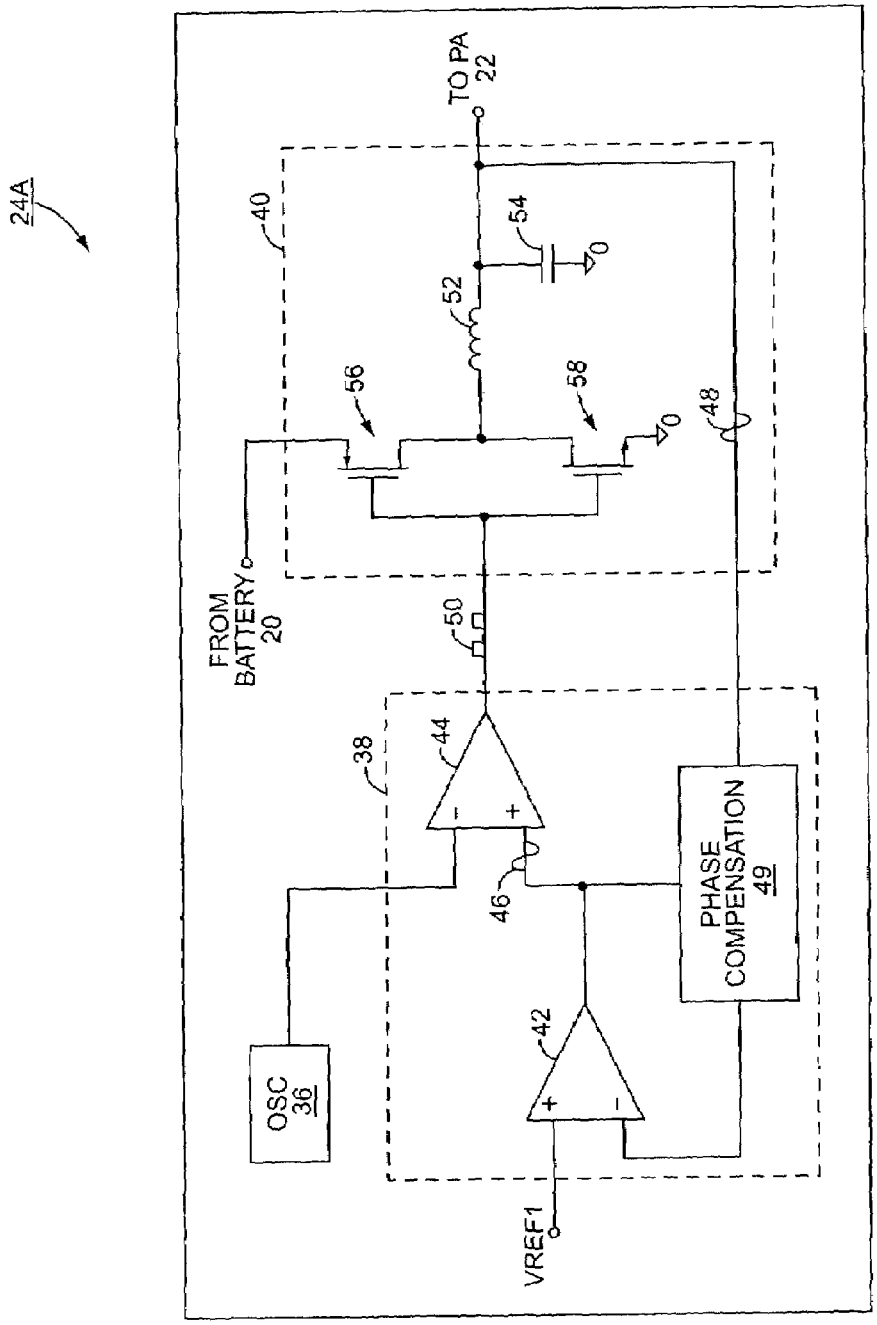
FIG. 3 illustrates a block diagram of a typical switching DC-DC converter.

A more detailed schematic of a typical DC-DC converter 24 is illustrated in FIG. 3. In particular, the DC-DC converter is, in the illustrated embodiment, a Buck converter 24A. The Buck converter 24A includes an oscillator (OSC) 36, a converter control system 38, and a power train 40. The converter control system 38 in this example includes an error amplifier 42 and a modulator 44. The oscillator 36 outputs a saw-tooth voltage waveform derived from the voltage on an internal capacitor (not illustrated). In the example, the saw-tooth wave form ramps up and ramps down. Other oscillators 36 may provide a ramp up followed by a rapid return. Regardless of the particular wave form, the voltage is fed to the modulator 44 where it is compared to an error voltage signal 46 from the error amplifier 42.

In the embodiment illustrated, the converter control system 38 operates according to a pulse width modulation scheme as is well understood, although other arrangements are possible and applicable to the present invention. Specifically, the error amplifier 42 of the converter control system 38 compares a feedback signal 48 to a voltage reference (VREF1) and generates the error voltage signal 46. The feedback signal 48 may be conditioned by phase compensation circuitry 49 for stability purposes. The error voltage signal 46 provides the threshold level used by the modulator 44 in processing the signal from the oscillator 36 to generate a signal 50. When the signal from the oscillator 36 is above the threshold determined by the error voltage signal 46, the signal 50 provided to the power train 40 is low. Conversely, when the signal 50 from the oscillator 36 is below the error voltage signal 46 threshold, the power train 40 receives a high signal. In general, the signal 50 driving the power train 40 is a square wave with a duty cycle determined by the level of the error voltage signal.

The power train 40 includes an inductor 52, a capacitor 54, plus two switches 56, 58. The switches 56, 58 are, in the illustrated embodiment a p-channel FET and an N-channel FET respectively as is well understood for a typical buck topology. The square wave signal 50 turns the switches 56, 58 on and off. When the signal 50 is low, switch 56 is ON and switch 58 is OFF. This presents a voltage close to the voltage from the battery 20 to the inductor 52 causing an increase in current and storing energy in the inductor 52's magnetic field. Current is supplied to the power amplifier 22 and to the capacitor 54. When the signal 50 is high, switch 56 is OFF and switch 58 is ON. This connects the input of the inductor 52 to ground. As a result, the inductor 52 provides decreasing current to the power amplifier 22, while drawing energy from its magnetic field. As the output voltage droops, the capacitor 54 discharges and provides some of the load current.

The present invention lies in the oscillator 36 and is illustrated variously in FIGS. 4, 6, 8, and 10 with accompanying flow charts in FIGS. 5A, 5B, 7A, 7B, 9A, 9B, 11A, and 11B. Specifically, the present invention periodically varies the frequency at which the oscillator 36 operates thus periodically changing the frequency of any ripple that appears in Vcc. Since the frequency of the ripple changes, the location in the frequency spectrum of the spurs changes. By moving the location of the spurs in the frequency spectrum, the energy at any given frequency is reduced, thereby helping meet the side band emissions requirements.

Figure 4:
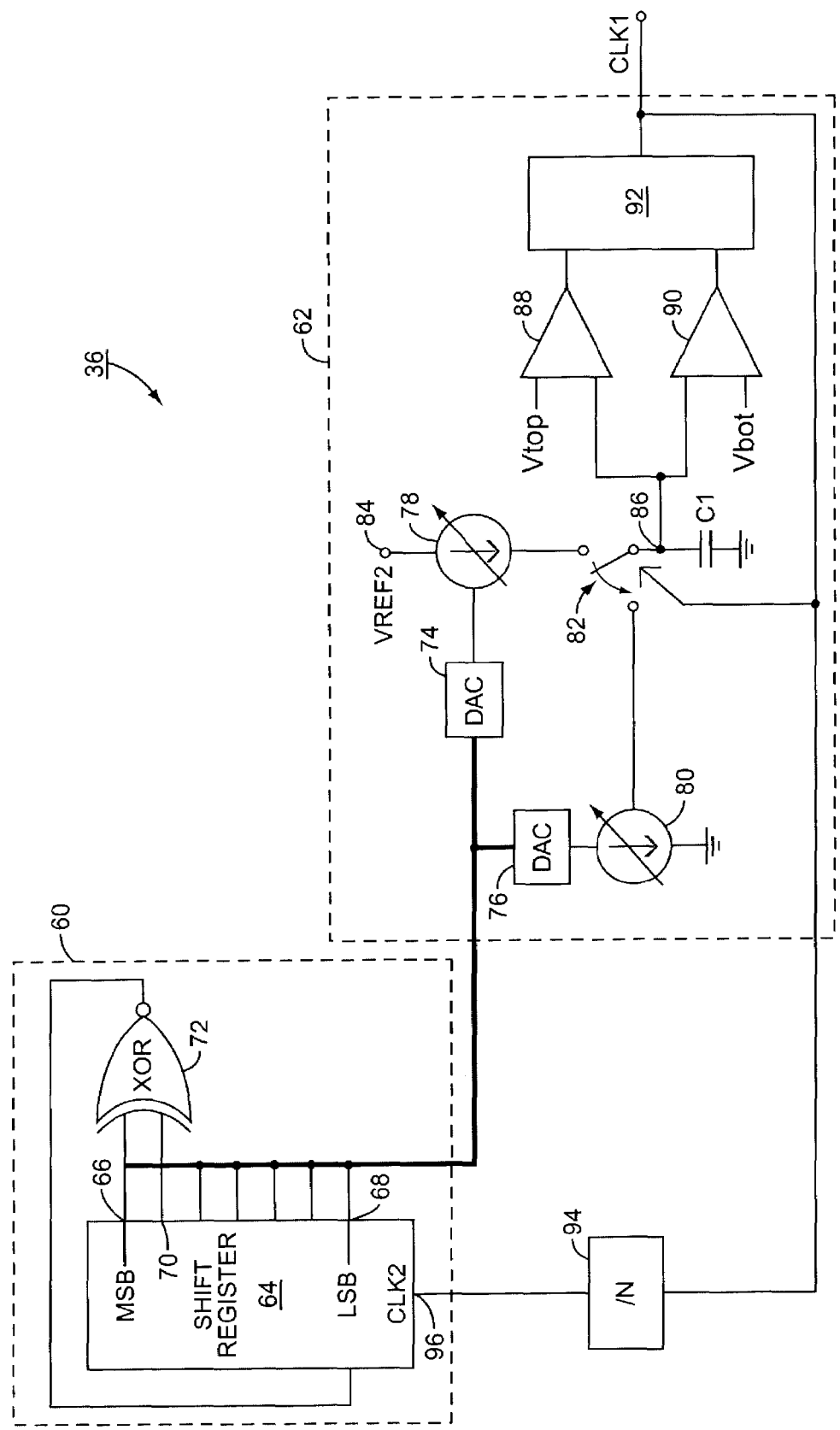
FIG. 4 illustrates a block diagram of a first exemplary embodiment of the switching power supply of the present invention.

In a first embodiment, illustrated in FIG. 4, the oscillator 36 includes a pseudo random number generator 60 and a clock generation circuit 62. The pseudo random number generator 60 includes a seven bit shift register 64 with a most significant bit (MSB) output 66 and a least significant bit (LSB) output 68. Two outputs (which in the exemplary embodiment are the MSB output 66 and the next most significant bit output 70) are directed to an exclusive OR (XOR) gate 72. The output of the XOR gate 72 is fed back into an input of the shift register 64, thereby causing the shift register 64 to count in a pseudo random fashion and thus output a pseudo random number. This is known as a linear feedback shift register (LFSR) and is well known in the art. Other pseudo random number generators 60 could also be used if needed or desired. Likewise, the number of bits in the shift register may vary from embodiment to embodiment as needed or desired.

In addition to the outputs sent to the XOR gate 72, the outputs collectively are sent to the clock generation circuit 62. The clock generation circuit 62 includes a first digital to analog converter (DAC) 74 and a second digital to analog converter (DAC) 76. The DACs 74, 76 translate the digital signal from the pseudo random number generator 60 into an analog setting that controls variable current sources 78, 80 respectively. That is, the amount of current that flows through the current sources 78, 80 is varied by the DACs 74, 76. The current sources 78, 80 are selectively connected to a capacitor C1 by a switch 82. The first current source 78 is connected to a reference voltage supply (VREF2) 84 and thus provides current to the capacitor C1 when connected thereto, while the second current source 80 is connected to ground and thus acts as a current sink for the capacitor C1 when connected thereto. When the switch 82 is connected to the first current source 78, the capacitor C1 charges. When the switch 82 is connected to the second current source 80, the capacitor C1 discharges.

As capacitor C1 charges and discharges, a voltage is present at node 86 corresponding to the charge on the capacitor C1. The voltage at node 86 has a saw tooth voltage waveform due to the current that flows into and out of the capacitor C1. This voltage at node 86 is presented to comparators 88, 90. First comparator 88 compares the voltage at node 86 to a predefined voltage level Vtop and second comparator 90 compares the voltage at node 86 to a predefined voltage level Vbot. If the voltage at node 86 exceeds Vtop, the first comparator 88 sends a signal to a flip-flop 92. If the voltage at node 86 dips below Vbot, the second comparator 90 sends a signal to the flip-flop 92.

The act of sending a signal to the flip-flop 92 from either comparator 88 or 90 causes a clock pulse (CLK1) to be output by the flip-flop 92. This clock pulse controls the switch 82 and is further directed to a divide by N element (/N) 94. The divide by N element 94 may have a counter which counts the pulses received in CLK1 and determines if N pulses have been received. Once N pulses have been received, the divide by N element 94 outputs a pulse (CLK2) which is received by the shift register 64 at clock input (CLK2) 96. Thus, the divide by N element 94 effectively divides CLK1 by N to arrive at CLK2. The receipt of the CLK2 signal causes the shift register to perform a "count" and change the pseudo random number being output.

In an exemplary embodiment, the value of N in the divide by N element 94 is such that the pseudo random number output by the shift register changes approximately once every four milliseconds. Since a clock pulse is usually emitted from the flip-flop 92 approximately every four microseconds, N is in the neighborhood of 1000. Having the pseudo random number change approximately once every four milliseconds happens to correspond to the frequency of the transmission bursts in the GSM protocol and the measurement standard propounded under the GSM protocol. Likewise, this time period allows the transient response of the DC-DC converter 24 to settle between changes of the pseudo random number.

A signal derived from the capacitor voltage 86 is sent from the oscillator 36 to the converter control system 38 as needed or determined by the converter control system 38.

Figure 5A:
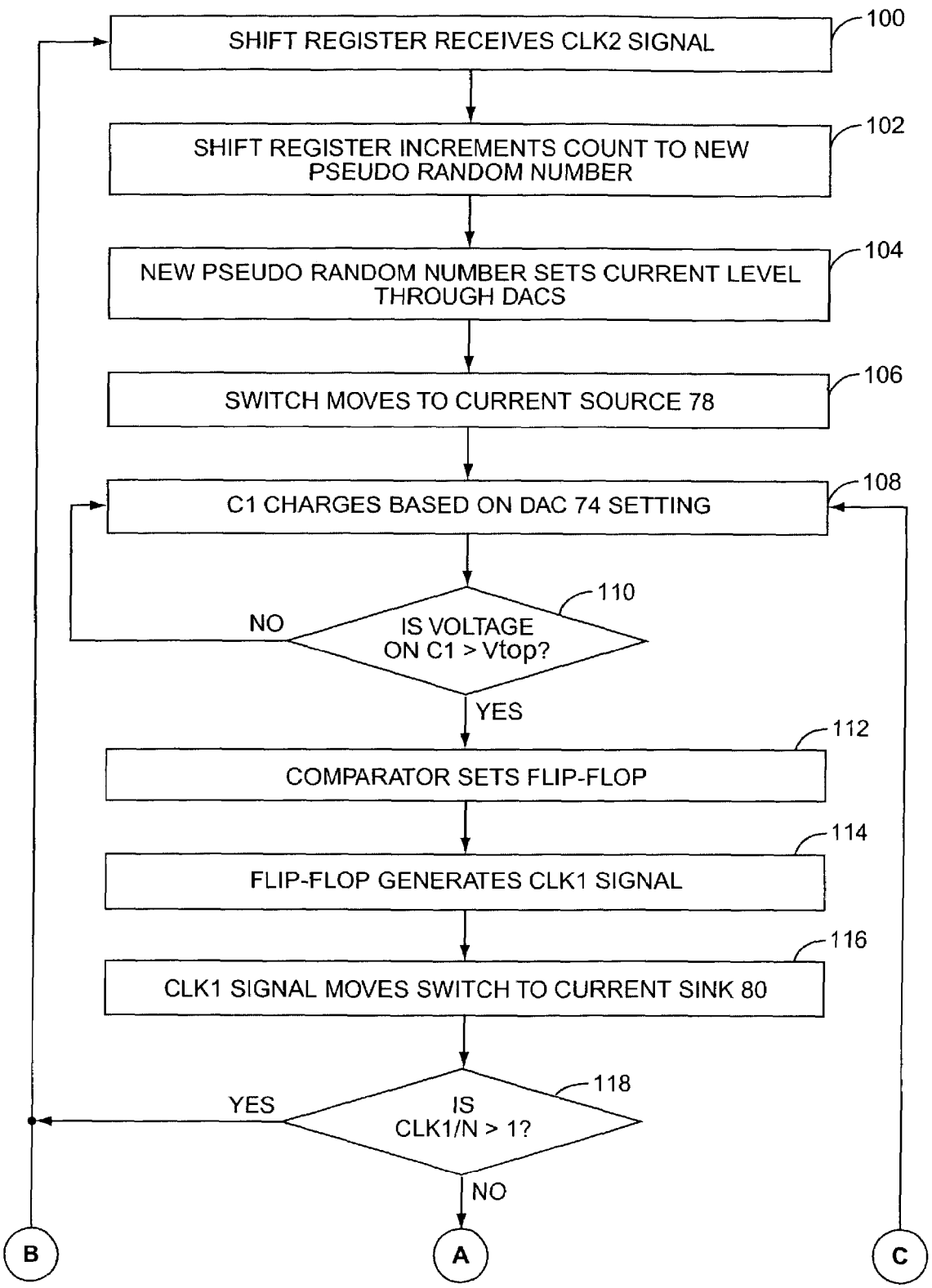
FIGS. 5A and 5B illustrate a flow chart showing operation of the embodiment of FIG. 4 in use.
Figure 5B:
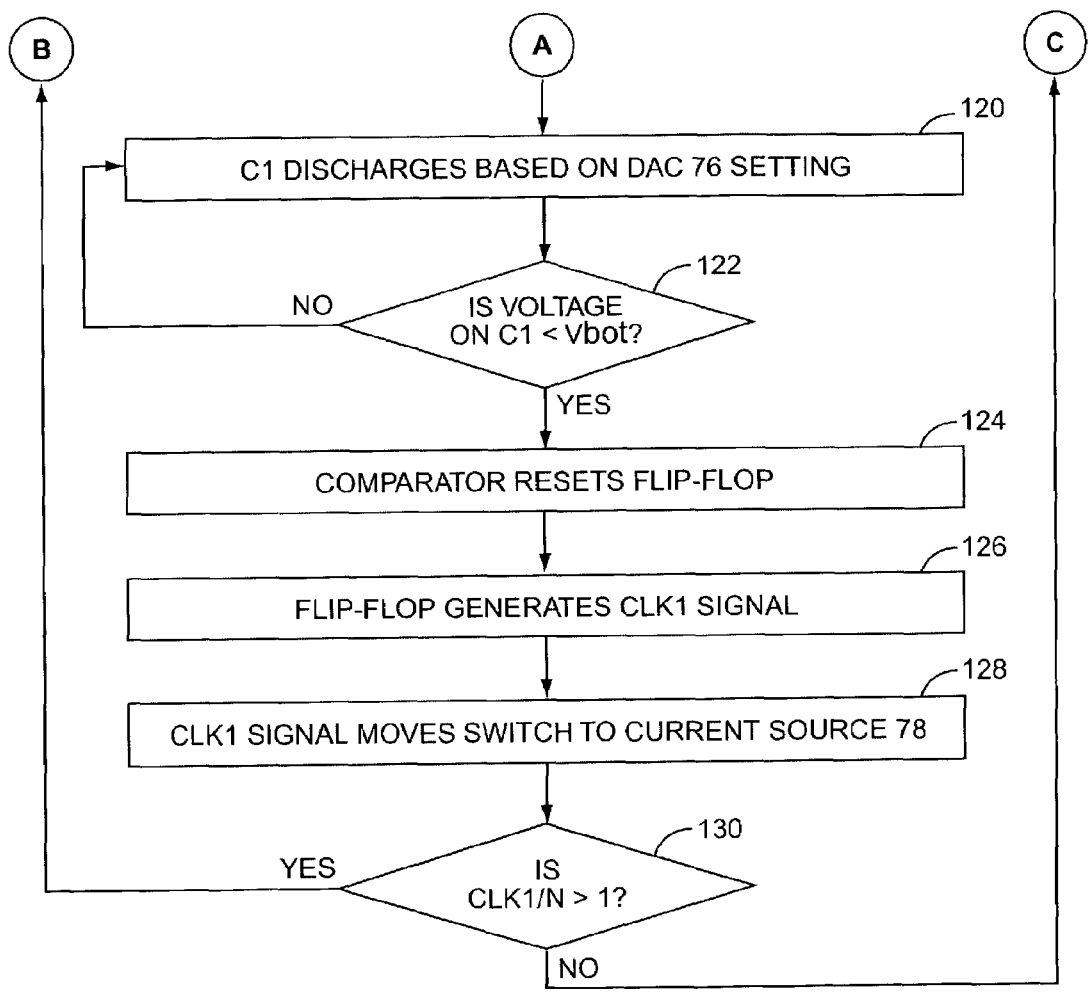

A flow chart of the present invention in use is presented in FIGS. 5A and 5B. The process is continuous as long as the mobile terminal 10 is in the transmit mode, so the choice of a starting point is arbitrary. However, for the purposes of explanation, the process begins when the shift register 64 receives a CLK2 signal at the clock input 96 (block 100) in FIG. 5A. The shift register 64 increments the count to a new pseudo random number (block 102). The new pseudo random number sets the DACs 74, 76 and thus the current level through the current sources 78, 80 (block 104).

The switch 82 moves to the current source 78 (block 106). The capacitor C1 charges based on the DAC 74 setting (block 108). The comparator 88 determines if the voltage on the capacitor C1 as measured at node 86 is greater than Vtop (block 110). If the answer is no, the capacitor C1 continues to charge. If the answer is yes, the comparator 88 sets the flip-flop 92 (block 112). As a result of the signal to the flip-flop 92, the flip-flop 92 generates a CLK2 signal (block 114). The CLK2 signal from the flip-flop 92 moves the switch 82 to the current source 80 which sinks current (block 116).

The CLK2 signal from the flip-flop 92 also travels to the divide by N element 94. The divide by N element 94 determines if the number of pulses in the CLK2 signal since the last change in the pseudo random number divided by N is greater than 1 (block 118). If the answer is yes, N pulses have been received by the divide by N element 94 since the last change in the pseudo random number, the divide by N element 94 sends a CLK2 signal to the clock input 96 of the shift register 64, and the process repeats. If however, the answer to block 118 is no, fewer than N pulses have been received by divide by N element 94 since the last change in the pseudo random number, then the divide by N element 94 increments a count tracking the pulses, and the capacitor C1 discharges based on the setting of DAC 76 (block 120) as illustrated in FIG. 5B.

The comparator 90 determines if the voltage on the capacitor C1 as measured at node 86 is less than Vbot (block 122). If the answer is no, the capacitor C1 continues to discharge. If the answer is yes, the comparator 90 resets the flip-flop 92 (block 124). As a result of the signal to the flip-flop 92, the flip-flop 92 generates a CLK2 signal (block 126). The CLK2 signal moves the switch 82 to the current source 78 (block 128). The CLK2 signal from the flip-flop 92 also travels to the divide by N element 94.

The divide by N element 94 determines if the number of pulses in the CLK2 signal since the last change in the pseudo random number divided by N is greater than 1 (block 130). If the answer is yes, N pulses have been received by the divide by N element 94 since the last change in the pseudo random number, the divide by N element 94 sends a CLK2 signal to the clock input 96 of the shift register 64 and the process repeats. If however, the answer to block 130 is no, fewer than N pulses have been received by divide by N element 94 since the last change in pseudo random number, then divide by N element 94 increments a count and the capacitor C1 charges based on the setting for first DAC 74 (block 108) (FIG. 5A).

As noted above, the pseudo random number generator 60 may take a number of different forms. Likewise, the clock generation circuit 62 may take a number of different forms. Other embodiments of the clock generation circuit 62 are set forth below.

Figure 6:
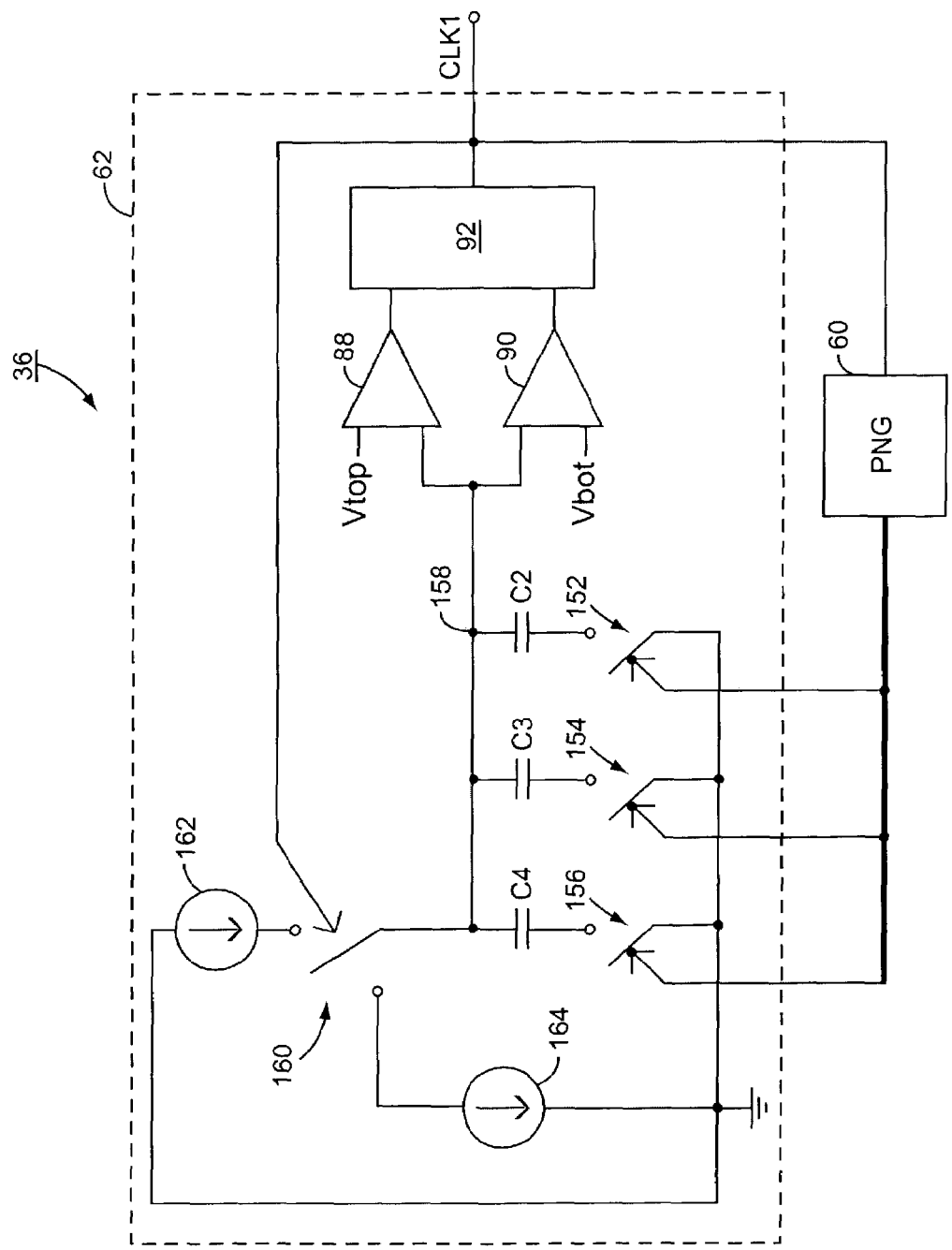
FIG. 6 illustrates a block diagram of a second exemplary embodiment of the switching power supply of the present invention.

A second embodiment of the clock generation circuit 62 is presented in FIG. 6. In this embodiment, the pseudo random number generator (PNG) 60 outputs the pseudo random number, which in turn controls switches 152, 154, 156. The switches 152, 154, 156 selectively activate capacitors C2, C3, and C4 respective to node 158. It should be appreciated that the pseudo random number output by the pseudo random number generator 60 maps which capacitors are activated. Also, there may be more or fewer capacitors than C2–C4. For example, if the pseudo random number generator 60 used a seven bit register, there might be seven capacitors, with each bit mapping to a capacitor. As another alternative, a varactor could be used in place of a plurality of capacitors, and the amount of capacitance would be set by the pseudo random number.

In this context, the capacitors C2, C3, and C4 may be physically connected to the node regardless of the position of the switches 152, 154, 156, but the capacitors C2, C3, and C4 are effectively open circuits until the switches 152, 154, and 156 are closed. Thus, as used herein, "activate" or "activated" means that the corresponding switch is closed and the capacitor completes a circuit. Node 158 acts like the node 86 in the first embodiment and is the point from which measurements are made by comparators 88, 90 to trigger the flip-flop 92. The saw-tooth signal at node 158 may be used by the modulator 44 (FIG. 3). The flip-flop 92 generates the CLK2 signal as previously described which may go to a divide by N element (not shown in FIG. 6) and a switch 160. The switch 160 selectively connects the node 158 to one of the current sources 162 or 164. The current source 162 charges the capacitors that are activated by the switches 152, 154, 156 when the current source 162 is connected to node 158 by the switch 160. The current source 164 discharges the capacitors C2, C3, and C4 that are activated when the current source 164 is connected to node 158 by the switch 160.

Whereas in the first example the current doing the charging and discharging varied based on the pseudo random number generator 60, this embodiment varies the capacitance as a function of the output of the pseudo random number generator 60. Varying the capacitance effectively changes the period of the charging and discharging as effectively as changing the current levels that do the charging and discharging.

Figure 7A:
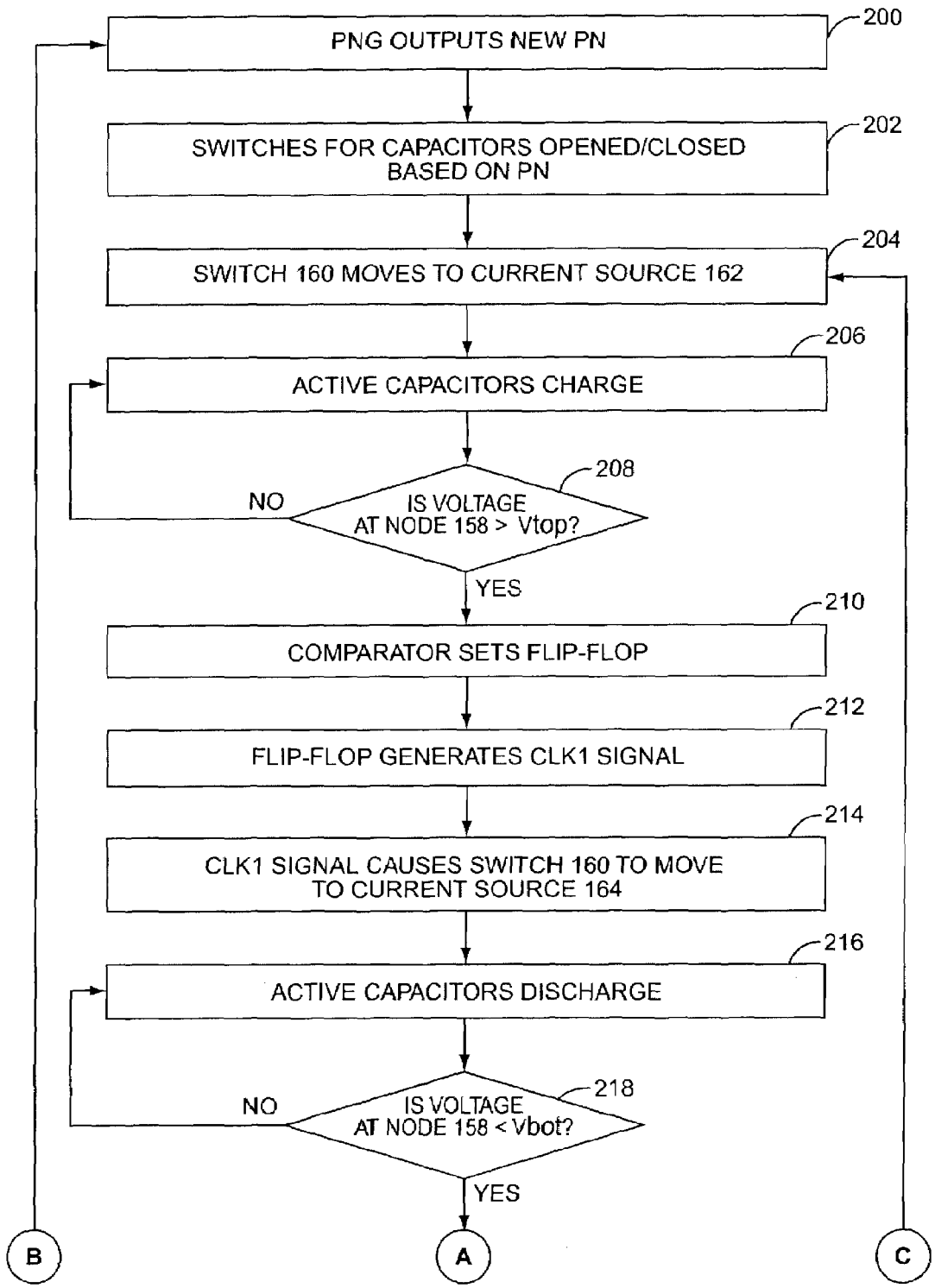
FIGS. 7A and 7B illustrates a flow chart showing the embodiment of FIG. 6 in use.
Figure 7B:
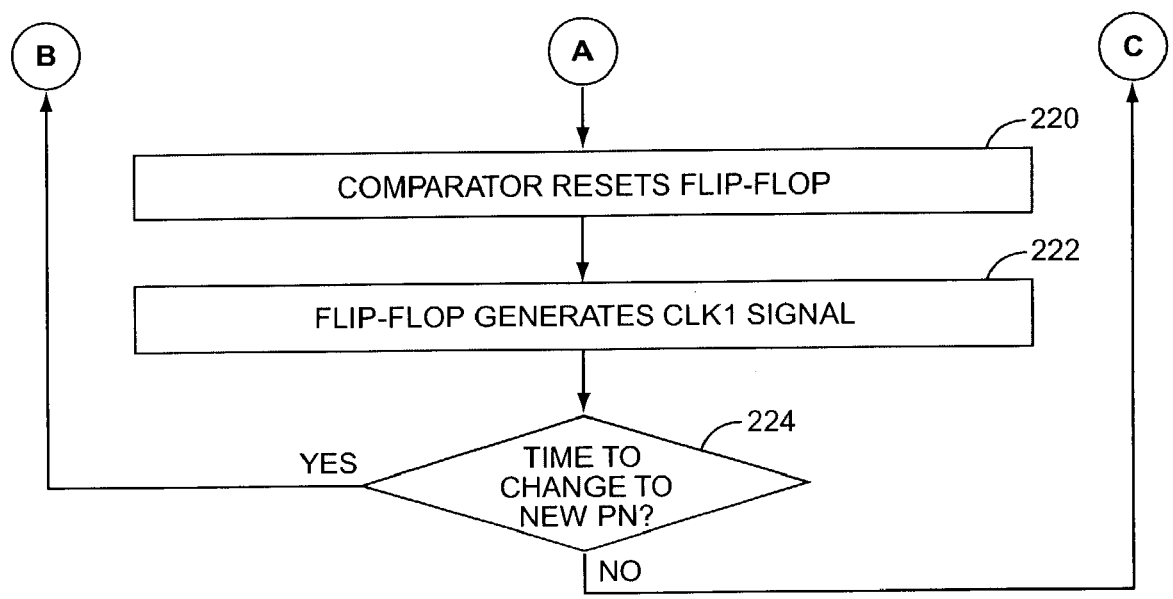

A flow chart illustrating the functionality of the second embodiment is presented in FIGS. 7A and 7B. Again, because of the continuous nature of the process, the starting point is somewhat arbitrary. The pseudo random number generator (PNG) 60 outputs a new pseudo random number (PN) (block 200). The PN determines which of the capacitors are activated, and the switches 152, 154, 156 are opened or closed based on the PN (block 202). The switch 160 also moves to complete the circuit with the current source 162 (block 204). The current flows through the current source 162 into the activated capacitors, and the activated capacitors charge (block 206).

The voltage at node 158 is presented to the comparators 88 and 90 and a determination is made as to whether the voltage at node 158 is greater than Vtop (block 208). If the answer is no, the activated capacitors continue to charge. If the answer to block 208 is yes, the voltage at node 158 is greater than Vtop, then the comparator 88 sets the flip-flop 92 (block 210). The flip-flop 92 generates a pulse in the CLK2 signal (block 212). The CLK2 signal pulse causes the switch 160 to move to current source 164 (block 214). The current source 164 draws current out of the activated capacitors and the activated capacitors discharge (block 216).

As the capacitors discharge, the comparator 90 determines if the voltage at node 158 is less than Vbot (block 218). If the answer is no, the capacitors continue to discharge. If the answer to block 218 is yes, the voltage at node 158 has dropped below Vbot, then the comparator 90 resets the flip-flop 92 (block 220) as illustrated in FIG. 7B. The flip-flop generates a pulse in the CLK2 signal (block 222).

It should be appreciated that periodically a determination may be made as to whether it is time to change the PN (block 224). This may be done through the divide by N element 94 (not shown in FIG. 6) or other technique as needed or desired. Further, the determination may be made at various locations in the flow chart, although only one is illustrated. In the embodiment illustrated, if the determination is negative, then the switch 160 is moved to current source 162 (block 204) and the process continues; otherwise, a new PN may be generated (block 200).

Figure 8:
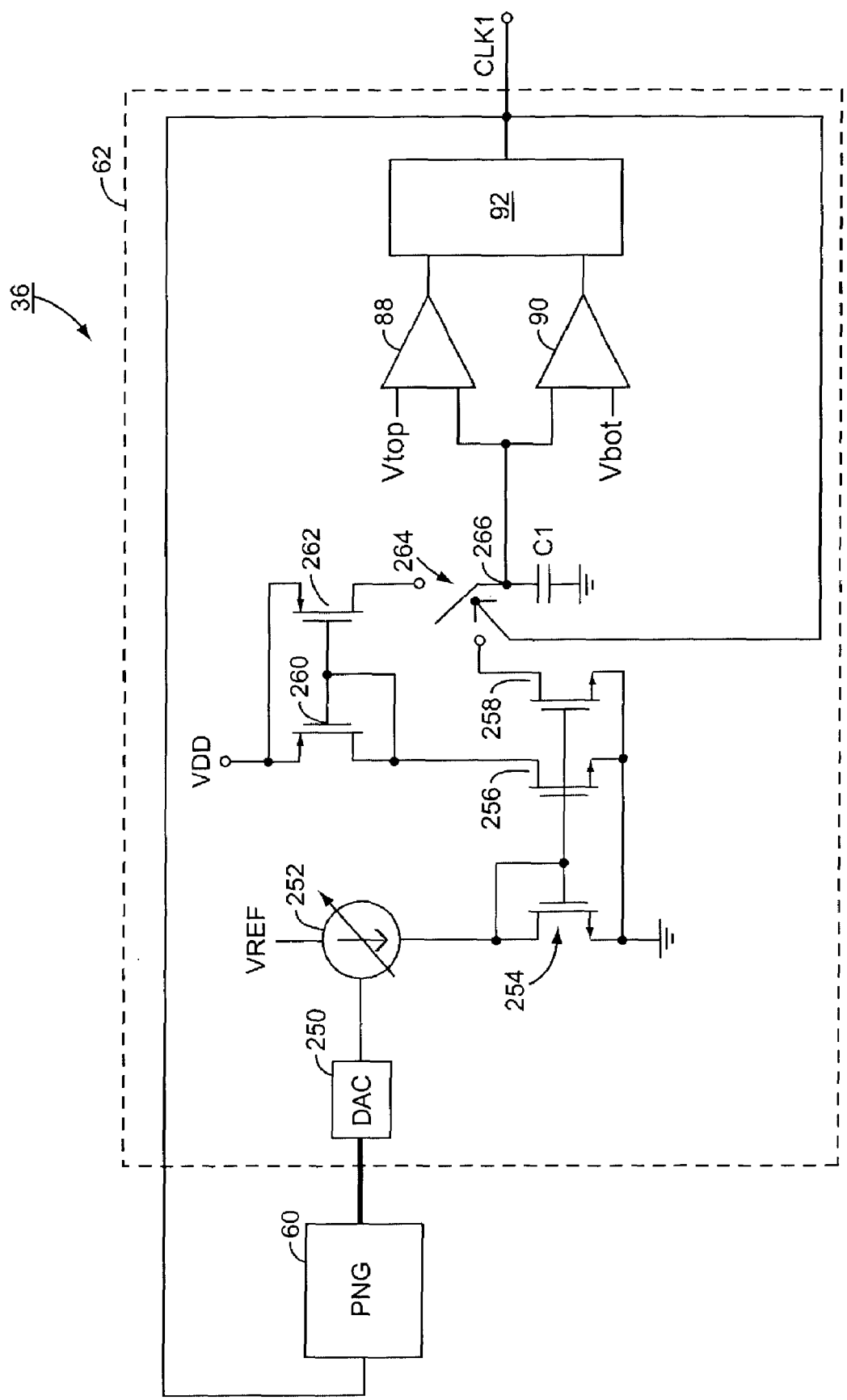
FIG. 8 illustrates a block diagram of a third exemplary embodiment of the switching power supply of the present invention.

A third embodiment is illustrated in FIG. 8. The PNG 60 outputs a pseudo random number to a DAC 250 that in turn controls a variable current source 252. The variable current source 252 outputs a current that is mirrored from a first Field Effect Transistor (FET) 254 to a second FET 256 and a third FET 258. The current mirrored into the second FET 256 forces a current to exist in a fourth FET 260. The current in the fourth FET 260 is mirrored into a fifth FET 262. While FETs are illustrated, other current mirroring mechanisms could also be used.

The third FET 258 acts as a current sink and the fifth FET 262 acts as a current source for the capacitor C1 depending on the position of the switch 264. This embodiment has the advantage of taking up less space in a semiconductor than the two DAC arrangement of FIG. 4, but at the expense of wasted current.

The comparators 88, 90 measure the voltage at node 266 and set and reset the flip-flop 92 much as previously described. The flip-flop 92 generates a CLK2 signal, whose pulses move the switch 264 and periodically cause a new pseudo random number to be generated by the PNG 60. The saw-tooth signal on the capacitor C1 at node 266 may be used by the modulator 44 (FIG. 3) as previously explained.

Figure 9A:
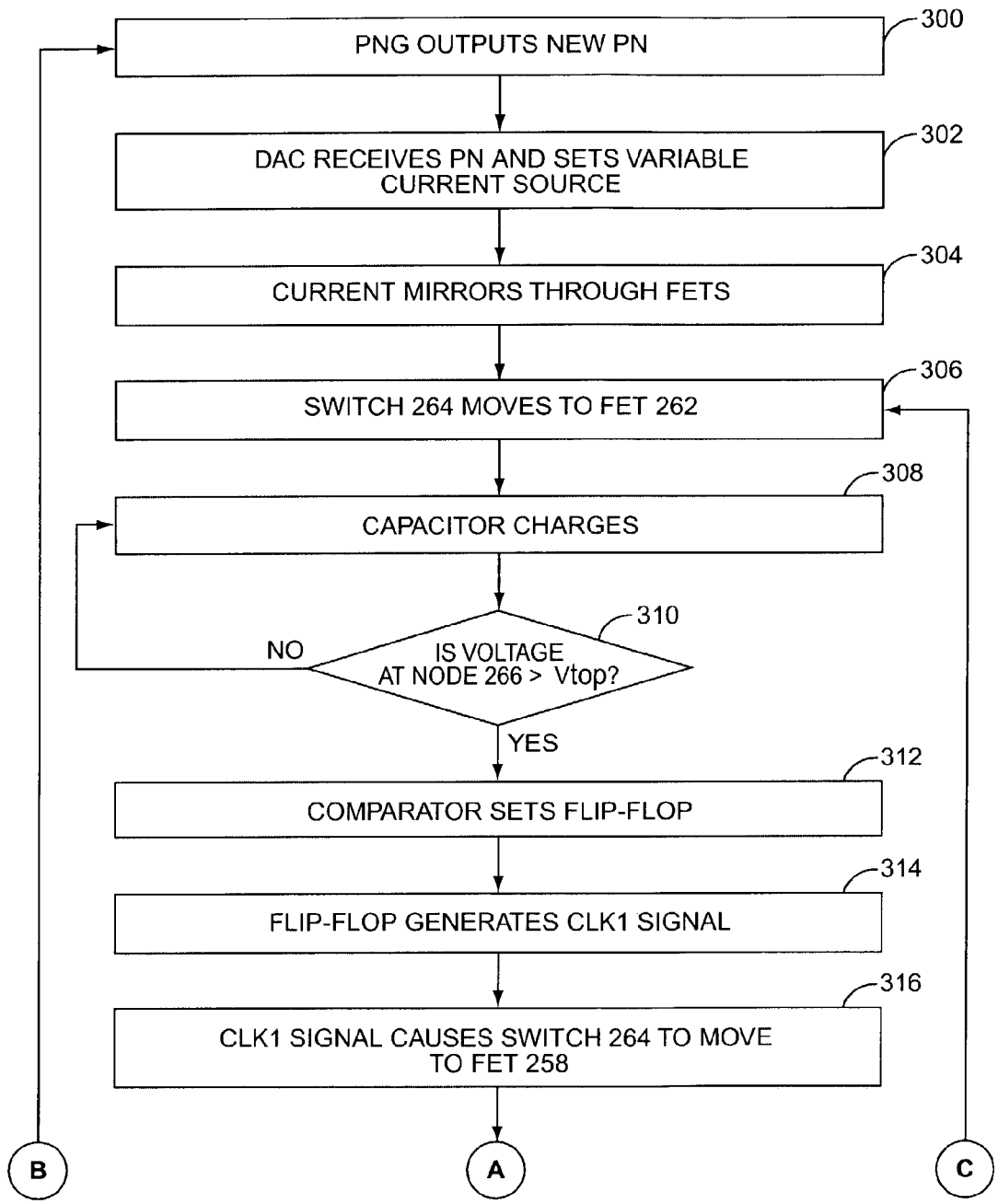
FIGS. 9A and 9B illustrates a flow chart showing operation of the embodiment of FIG. 8 in use.
Figure 9B:
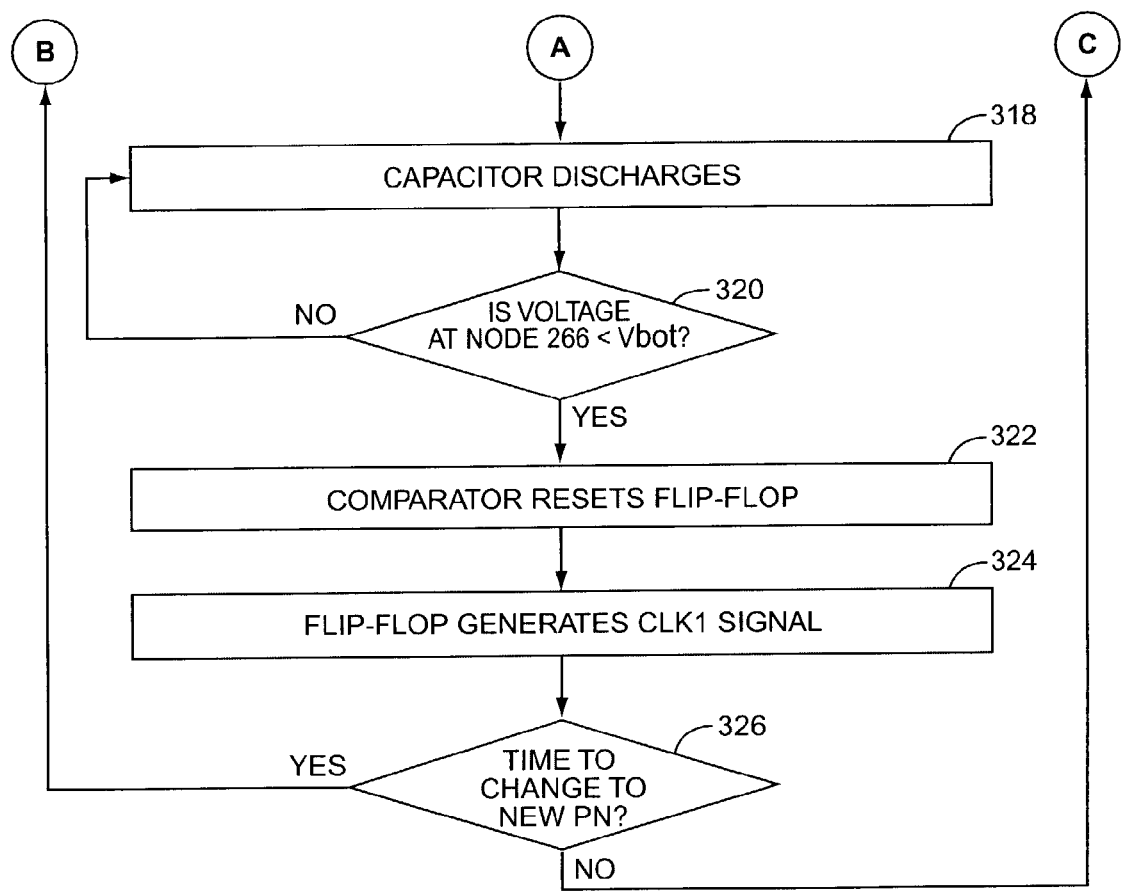

A flow chart of the operation of the embodiment of FIG. 8 appears in FIGS. 9A and 9B. The pseudo random number generator (PNG) outputs a new pseudo random number (PN) (block 300). The DAC 250 receives the PN and sets the current level for the variable current source 252 (block 302). The current passes through the current source 252 and is mirrored about by the various FETs (block 304). The switch 264 moves to FET 262 (block 306). The capacitor C1 charges (block 308).

The comparator 88 determines if the voltage at node 266 is greater than Vtop (block 310). If the answer to the inquiry at block 310 is no, then the capacitor C1 continues to charge. If the answer to the inquiry at block 310 is yes, the voltage at node 266 is greater than Vtop, then the comparator 88 sets the flip-flop 92 (block 312). The flip-flop 92 generates a pulse in the CLK2 signal (block 314).

The pulse in the CLK2 signal causes the switch 264 to move to the FET 258 (block 316). The capacitor C1 now discharges through FET 258 (block 318) as illustrated in FIG. 9B. The comparator 90 determines if the voltage at node 266 is less than Vbot (block 320). If the answer to the inquiry at block 320 is no, then the capacitor C1 continues to discharge. If, however, the answer to the inquiry at block 320 is yes, the voltage at node 266 is less than Vbot, then the comparator 90 resets the flip-flop 92 (block 322).

The flip-flop 92 generates a pulse in the CLK2 signal (block 324). It should be appreciated that periodically a determination may be made as to whether it is time to change the PN (block 326). This may be done through the divide by N element 94 (not shown in FIG. 8) or other technique as needed or desired. Further, the determination may be made at various locations in the flow chart, although only one is illustrated. In the embodiment illustrated, if the determination is negative, then the switch 264 may move to the FET 262 (block 306) and the capacitor C1 charges (block 308); otherwise, a new PN may be generated (block 300).

Figure 10:
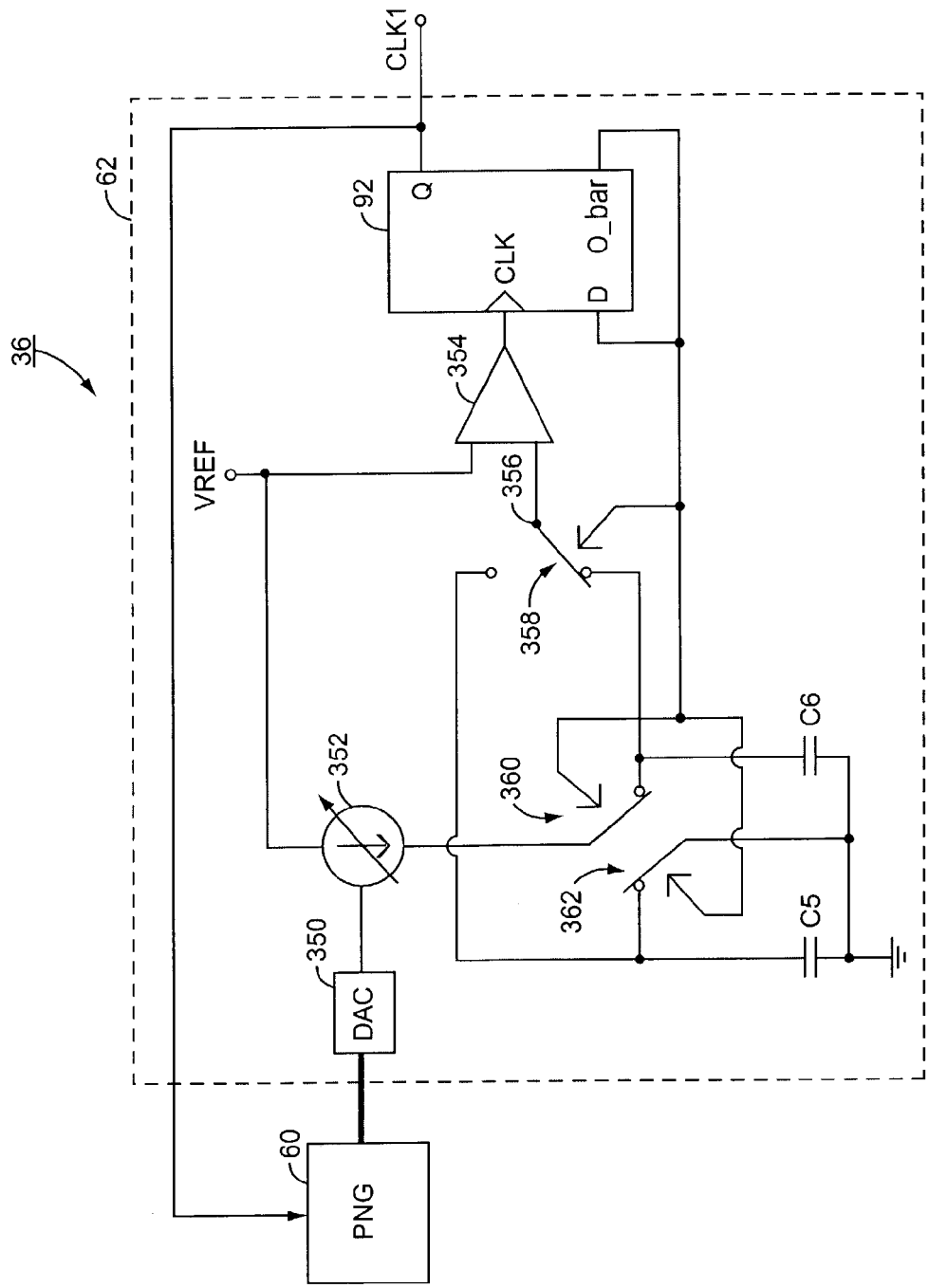
FIG. 10 illustrates a block diagram of a fourth exemplary embodiment of the switching power supply of the present invention.

A fourth embodiment is illustrated in FIG. 10. The PNG 60 outputs a pseudo random number that is passed to a DAC 350. The DAC 350 controls a variable current source 352 that alternately charges two capacitors C5 and C6. A comparator 354 compares VREF to the voltage at node 356. The voltage at node 356 is set by the position of the switch 358 and the positions of the switches 360, 362. The comparator 354 outputs a signal to the flip-flop 92 which generates a CLK2 signal for use by the PNG 60. The saw-tooth voltage at node 356 may be used by the modulator 44 (FIG. 3) as previously explained.

As shown, C6 is charging from the variable current source 352 and C5 is discharging. When the switches 360 and 362 switch, C5 is charging and C6 is discharging. The position of switch 358 determines if the voltage at node 356 is the voltage on C5 or the voltage on C6. The flip-flop 92 and the state thereof control the switch settings for the switches 358, 360, and 362. The voltage seen by the comparator 354 is a rising ramp followed by a rapid drop as the other discharged capacitor is switched in and then a rising ramp as that capacitor is charged. Note that this circuit may need a start-up or watch dog monitor since a non-oscillating mode does exist.

Figure 11A:
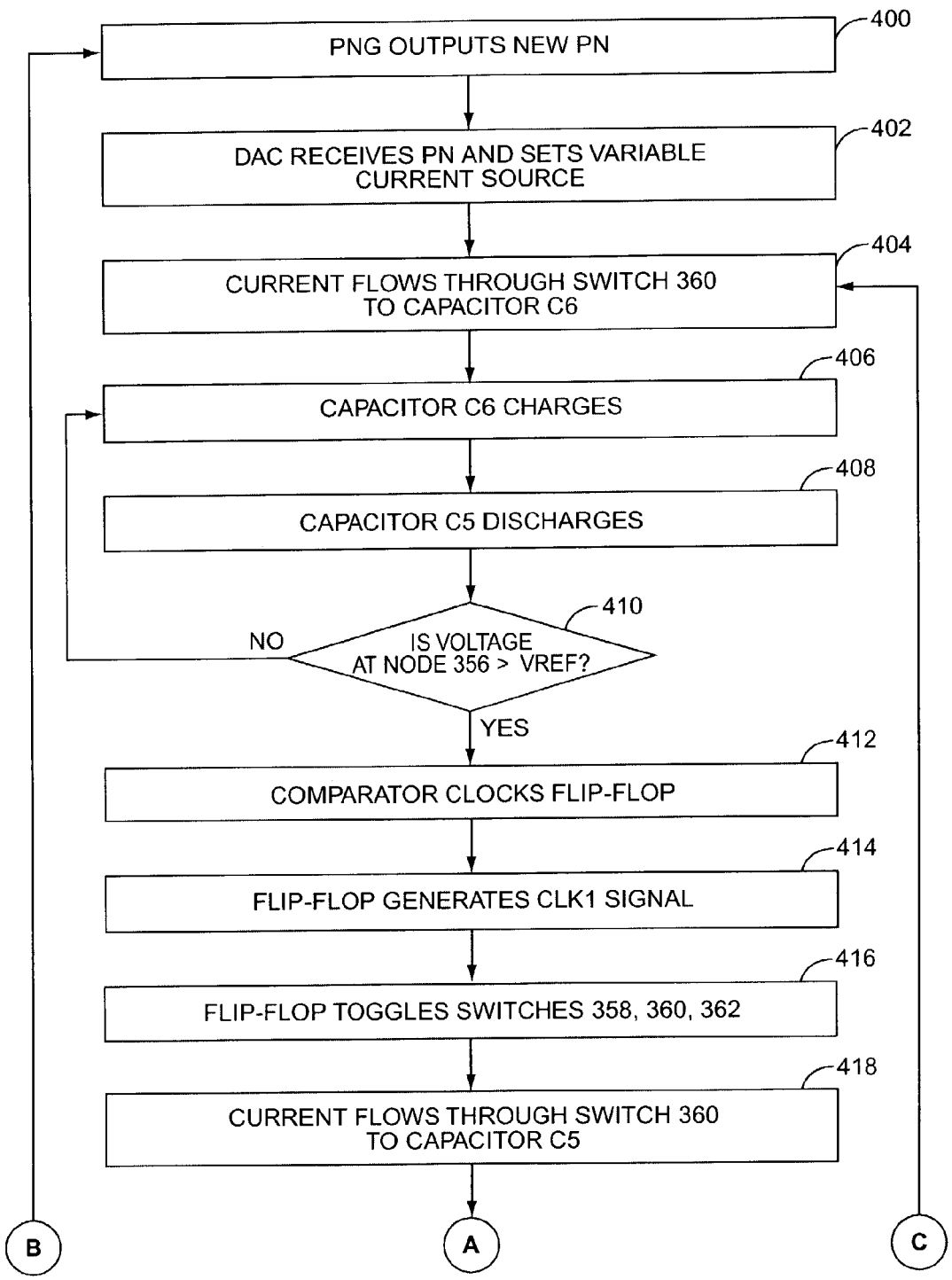
FIGS. 11A and 11B illustrates a flow chart showing operation of the embodiment of FIG. 10.
Figure 11B:
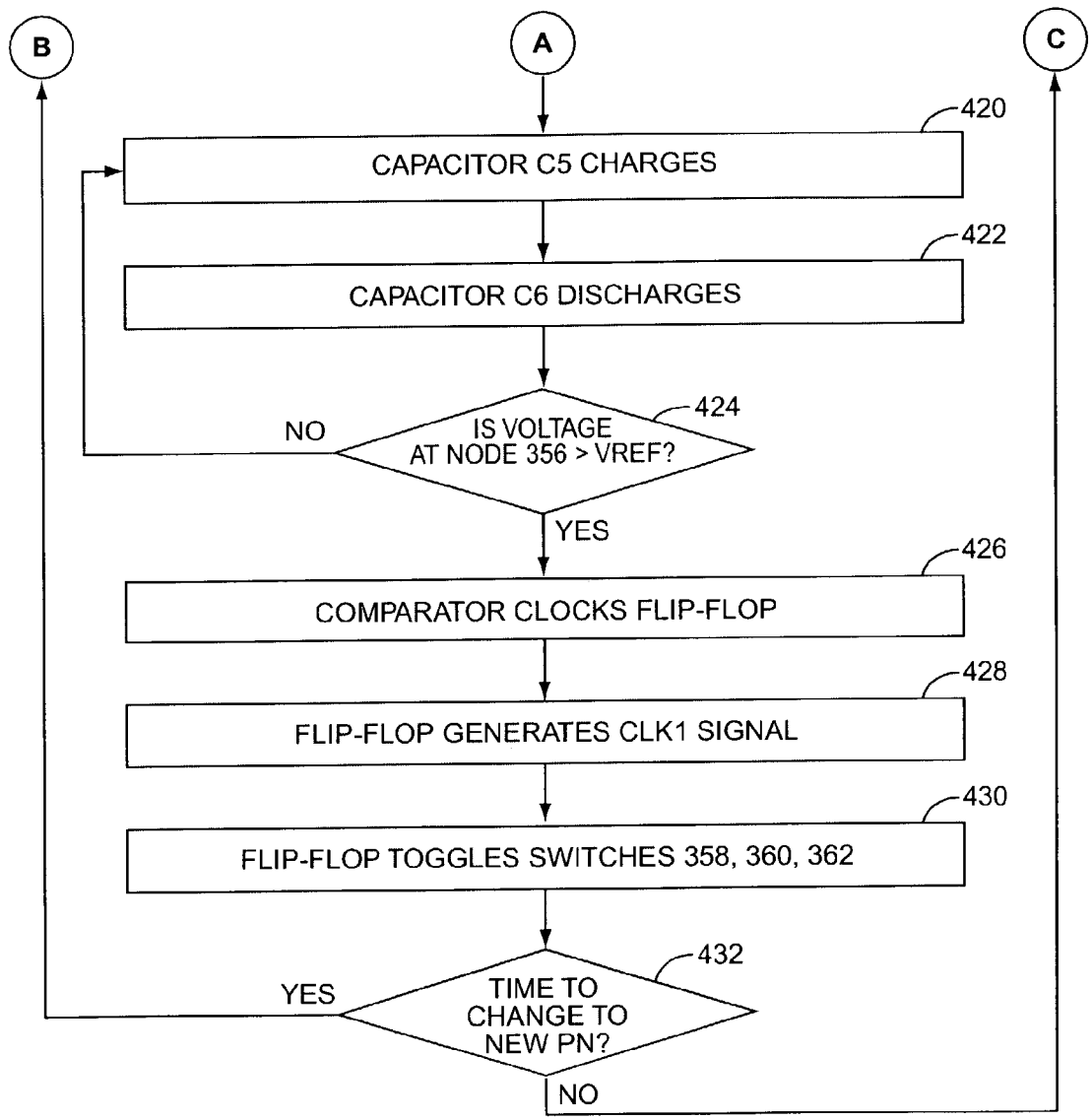

The functionality of the embodiment of FIG. 10 is set forth as a flow chart in FIGS. 11A and 11B. The PNG 60 outputs a new PN (block 400). The DAC 350 receives the PN and sets the current level of the variable current source 352 (block 402). Current flows through the variable current source 352 to the capacitor C6 (block 404). The capacitor C6 charges (block 406). Meanwhile, the switch 362 closes the loop for capacitor C5, and capacitor C5 discharges (block 408).

The comparator 354 determines if the voltage at node 356 is greater than VREF (block 410). If the answer is no, then the capacitor C6 continues to charge and the capacitor C5 continues to discharge. If, however, the answer to the inquiry at block 410 is yes, the voltage at node 356 is greater than VREF, then the comparator 354 clocks the flip-flop 92 (block 412). The flip-flop 92 generates a pulse in the CLK2 signal (block 414). Further, the flip-flop 92 toggles the switches 358, 360, 362 (block 416).

Current now flows through the switch 360 to the capacitor C5 (block 418) and the comparator 354 measures the voltage at node 356 as a function of the charge on the capacitor C5. The capacitor C5 charges (block 420) as illustrated in FIG. 11B, and the capacitor C6 discharges (block 422).

The comparator determines if the voltage at node 356 is greater than VREF (block 424). If the answer is no, then the capacitor C5 continues to charge (block 420). If the answer to the inquiry at block 424 is yes, then the comparator clocks the flip-flop 92 (block 426). The flip-flop 92 generates a pulse in the CLK2 signal (block 428) and toggles the switches 358, 360, and 362 (block 430).

It should be appreciated that periodically, a determination may be made as to whether it is time to change the PN (block 432). This may be done through the divide by N element 94 (not shown in FIG. 10) or other technique as needed or desired. Further, the determination may be made at various locations in the flow chart, although only one is illustrated. If it is not time for a new PN, the process repeats from block 404. If it is time for a new PN, the process repeats from block 400.

While comparators 88, 90 are used throughout the exemplary embodiments, it is also possible to use inverter gates therefore. The ratio of the top and bottom transistor size may be skewed to change the logic threshold.

Those skilled in the art will recognize improvements and modifications to the preferred embodiments of the present invention. All such improvements and modifications are considered within the scope of the concepts disclosed herein and the claims that follow.

What is claimed is:
1. A DC-DC switching power supply, comprising:
a power train;
a variable frequency oscillator generating a variable frequency output as a function of a pseudo random number and comprising:
a pseudo random number generator providing the pseudo random number; and a digital to analog converter that takes the pseudo random number output by the pseudo random number generator and sets a current level as a function of the pseudo random number; and a control system adapted to control the power train as a function of the variable frequency output of the variable frequency oscillator.

2. The DC-DC switching power supply of claim 1 wherein said switching power supply comprises a boost converter.

3. The DC-DC switching power supply of claim 1 wherein said control system selectively gates a clock signal from the variable frequency oscillator to the power train.

4. The DC-DC switching power supply of claim 1 wherein said variable frequency oscillator further comprises a plurality of capacitors, said capacitors activated as a function of an output of the pseudo random number generator.

5. The DC-DC switching power supply of claim 3 wherein said variable frequency oscillator further comprises a capacitor adapted to charge and discharge as a function of said current level.

6. The DC-DC switching power supply of claim 5 wherein said variable frequency oscillator further comprises a plurality of current mirrors adapted to create a current sink and a current source so that the capacitor may charge and discharge.

7. The DC-DC switching power supply of claim 1 wherein said variable frequency oscillator further comprises a pair of capacitors both selectively charged and discharged in turn.

8. The DC-DC switching power supply of claim 1 wherein said switching power supply comprises a buck converter.

9. A DC-DC switching power supply, comprising:
a power train;
a variable frequency oscillator having an output and comprising:
a pseudo random number generator; and
a pair of digital to analog converters adapted to take a pseudo random number output by the pseudo random number generator and set a current level for charging and discharging a capacitor as a function of the pseudo random number; and
a control system adapted to control the power train as a function of the output of the variable frequency oscillator.

10. A method of operating a DC-DC converter comprising:
generating a variable frequency output with an oscillator as a function of a pseudo random number, generating the variable frequency output comprising:
generating the pseudo random number with the pseudo random number generator; and
providing the pseudo random number to a pair of digital to analog converters to set a current level used to charge and discharge a capacitor, thereby generating the variable frequency output as a function of the pseudo random number; and controlling a power train as a function of the variable frequency output.

11. The method of claim 10 wherein generating the pseudo random number with the pseudo random number generator comprises using a linear feedback shift register.

12. The method of claim 10 wherein controlling the power train as a function of the variable frequency output comprises selectively gating the variable frequency output to the power train.

13. The method of claim 10 further comprising using an output from a flip-flop to trigger generation of a new pseudo random number.

14. The method of claim 13 further comprising dividing the output from the flip-flop by a predetermined number such that a new pseudo random number is generated approximately once every 4 milliseconds.

* * * * *